(12) United States Patent
Neshaastegaran et al.

(10) Patent No.: US 11,323,302 B2
(45) Date of Patent: May 3, 2022

(54) DETECTION AND MITIGATION OF OSCILLATOR PHASE HIT

(71) Applicants: Peyman Neshaastegaran, Ottawa (CA); Ming Jian, Kanata (CA)

(72) Inventors: Peyman Neshaastegaran, Ottawa (CA); Ming Jian, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 118 days.

(21) Appl. No.: 16/811,335

(22) Filed: Mar. 6, 2020

(65) Prior Publication Data
US 2021/0281465 A1    Sep. 9, 2021

(51) Int. Cl.
| | | |
|---|---|---|
| H04L 27/34 | (2006.01) | |
| H04L 27/36 | (2006.01) | |
| H03B 5/04 | (2006.01) | |
| H04N 21/2383 | (2011.01) | |
| H04B 3/462 | (2015.01) | |
| H03B 5/20 | (2006.01) | |

(52) U.S. Cl.
CPC ............ H04L 27/362 (2013.01); H03B 5/04 (2013.01); H03B 5/20 (2013.01); H04B 3/462 (2013.01); H04N 21/2383 (2013.01)

(58) Field of Classification Search
CPC .. H04B 3/462; H03B 5/04; H03B 5/20; H04L 27/2698; H04L 27/27; H04L 27/34; H04L 27/362; H04L 27/38; H04L 27/3818; H04L 27/3854; H04L 27/3872; H04L 27/389; H04L 2025/0342; H04N 21/2383; H04W 56/0035
See application file for complete search history.

(56) References Cited

U.S. PATENT DOCUMENTS

| | | | |
|---|---|---|---|
| 7,636,021 B2 | 12/2009 | Rohde et al. | |
| 8,259,859 B2* | 9/2012 | Xu | .......................... H04L 27/38 375/326 |
| 8,477,888 B2* | 7/2013 | Lu | ....................... H04B 17/345 375/346 |
| 9,137,065 B2* | 9/2015 | Gotman | .................. H04L 1/005 |
| 9,178,546 B1* | 11/2015 | Klemes | .................... H04L 1/00 |
| 10,097,188 B2 | 10/2018 | Kushnir et al. | |

(Continued)

FOREIGN PATENT DOCUMENTS

| | | |
|---|---|---|
| CN | 1607788 A | 4/2005 |
| CN | 101911655 A | 12/2010 |

(Continued)

OTHER PUBLICATIONS

Neshaastegaran, Performance Enhancement of High Order LDPC Coded Modulation Systems With Application in Mobile Backhaul Networks, Dissertation, Ottawa-Carleton Institute for Electrical and Computer Engineering, 137 pages, Feb. 2021.*

(Continued)

*Primary Examiner* — Frank Duong (57) ABSTRACT

Some aspects of the present disclosure relate to detection of a Phase Hit and, upon detecting the Phase Hit, determining the magnitude and location of the Phase Hit. Detecting the Phase Hit may involve comparing a phase offset difference for successive pilot symbol to a detection threshold. Determination of the detection threshold may involve a Neyman-Pearson binary hypothesis testing (NP-BHT) approach. Once the magnitude and location of the Phase Hit are known, data symbols received after the location may be processed to remove the magnitude of the Phase Hit.

18 Claims, 7 Drawing Sheets

(56) References Cited

U.S. PATENT DOCUMENTS

| | | | |
|---|---|---|---|
| 2008/0102761 A1 | 5/2008 | Pham et al. | |
| 2019/0245569 A1* | 8/2019 | Shevchenko | H04B 17/336 |

FOREIGN PATENT DOCUMENTS

| | | | |
|---|---|---|---|
| CN | 104125182 A | | 10/2014 |
| CN | 106130616 A | | 11/2016 |
| EP | 1168617 A2 | | 1/2002 |
| WO | WO 2018177423 | * | 10/2018 |

OTHER PUBLICATIONS

Jian et al., A Double-Stage Phase Hit Mitigation Scheme in Microwave Backhaul Links, IEEE, 6 pages, 2020.*

Banihashemi et al., Log-Likelihood Ratio Calculation for Pilot Symbol Assisted Coded Modulation Schemes With Residual Phase Noise, IEEE, 9 pages, May 2019.*

Chen et al., Phase Noise Mitigation in OFDM-based Backhaul in the Presence of Channel Estimation and Synchronization Errors, IEEE, 5 pages, 2016.*

WO2018177423A1—Method and apparatus for correcting phase jump—Google Patents, https://patents.google.com/patent/WO2018177423A1/en, 21 pages, Aug. 27, 2021.*

U. L. Rohde and A. K. Poddar, "Distributed coupled resonator (DCR) oscillators/VCOs limit phase noise and phase hits," in IEEE Radio and Wireless Symposium, 2006, 4 pages.

Y. Shen, L. Villeneuve and N. Hassaine, "Dual loop push-push synthesizer for high modulation digital radios at 38GHz," in Asia-Pacific Microwave Conference, 2007, 4 pages.

* cited by examiner

DETECTION AND MITIGATION OF OSCILLATOR PHASE HIT

TECHNICAL FIELD

The present disclosure relates generally to detection and mitigation of an oscillator phase hit.

BACKGROUND

Quadrature amplitude modulation (QAM) is a digital communication technique that mixes both amplitude and phase variations in a carrier. QAM involves transmitting multiple bits for each time interval associated with a data symbol. The symbol is a combination of bits representing different combinations of phase and amplitude. The number M, used in "M-QAM," indicates the number of symbols in a constellation of possible symbols (unique combinations of amplitude and phase). A value $\log_2 M$ represents a number bits that are transmitted per time interval (i.e., per data symbol). For example, in 256-QAM, $\log_2 256=8$ bits are transmitted per time interval. It will be well understood that the carrier is typically a sinusoidal signal of a given frequency.

A QAM constellation may be graphically represented as a the symbols of the constellation as a set of points arranged around orthogonal axes.

A QAM receiver is typically implemented using a Local Oscillator (LO) having the same frequency as the carrier signal. The local oscillator allows the receiver to distinguish between each unique combination of amplitude and phase and, thereby, demodulate a received data symbol. In the case of 256-QAM, demodulating a received data symbol involves determining the 8 bits that have been transmitted in the time interval during which the data symbol was received.

Along with the transmitted signal that is a series of data symbols, the transmitter transmits a pilot symbol at regular intervals. At the receiver, these pilot symbols can be used to estimate the phase of the received signal. Carrier phase recovery involves estimating a phase of the received signal and determining an extent to which the estimated phase of the received signal is offset from an estimated phase of a reference signal, i.e., the reference signal received from a local oscillator.

It is important that the phase of the local oscillator remain constant. However, maintaining the phase of an LO is not always possible or practical in operational situations. It is known that, occasionally, a local oscillator will experience a severe change in its phase. The typical term for such a severe change is "phase hit," which may be shortened to "PH." While PHs are relatively rare, when a PH does occur, the PH often occurs due to thermal or mechanical instability in the local oscillator.

A PH can be modelled as a sudden rotation of the constellation. If it undetected and uncorrected, a sufficiently severe PH may result in received symbols being errantly mapped to an incorrect symbol in the un-rotated constellation. These errors, if left uncorrected can corrupt a data stream, and if not corrected quickly enough can result in a loss of communication integrity.

There are many sources of error in wireless digital communication. Conveniently, robust Forward Error Correction (FEC) codes have been developed to successfully mitigate many reception errors. Unfortunately, the bursts of errors that follow a PH are typically outside the error correcting capability of conventional FEC codes.

SUMMARY

Some aspects of the present disclosure relate to detection of a Phase Hit and, upon detecting the Phase Hit, determining the magnitude and location of the Phase Hit. Detecting the Phase Hit may involve comparing a phase offset difference for successive pilot symbols to a detection threshold. Determination of the detection threshold may involve a Neyman-Pearson binary hypothesis testing (NP-BHT) approach. Once the magnitude and location of the Phase Hit are known, data symbols received after the location may be processed to remove at least a portion the magnitude of the Phase Hit.

According to an aspect of the present disclosure, there is provided a method for mitigating an occurrence of a phase hit. The method includes receiving a signal comprising a plurality of data symbols and a plurality of pilot symbols, detecting a first phase offset between a signal from a local oscillator and a first pilot symbol among the plurality of pilot symbols, detecting a second phase offset between the signal from the local oscillator and a second pilot symbol among the plurality of pilot symbols, the second pilot symbol successive to the first pilot symbol and determining that a phase hit has occurred when a phase offset difference between the first phase offset and the second phase offset exceeds a detection threshold.

According to another aspect of the present disclosure, there is provided an apparatus for mitigating an occurrence of a phase hit. The apparatus includes a receiver configured to receive a signal comprising a plurality of data symbols and a plurality of pilot symbols, a local oscillator and a processor. The processor is configured to detect a first phase offset between a signal from the local oscillator and a first pilot symbol among the plurality of pilot symbols, detect a second phase offset between the signal from the local oscillator and a second pilot symbol among the plurality of pilot symbols, the second pilot symbol successive to the first pilot symbol and determine that a phase hit has occurred when the phase offset difference between the first phase offset and the second phase offset exceeds a detection threshold.

BRIEF DESCRIPTION OF THE DRAWINGS

For a more complete understanding of the present embodiments, and the advantages thereof, reference is now made, by way of example, to the following descriptions taken in conjunction with the accompanying drawings, in which.

DETAILED DESCRIPTION OF ILLUSTRATIVE EMBODIMENTS

For illustrative purposes, specific example embodiments will now be explained in greater detail in conjunction with the figures.

The embodiments set forth herein represent information sufficient to practice the claimed subject matter and illustrate ways of practicing such subject matter. Upon reading the following description in light of the accompanying figures, those of skill in the art will understand the concepts of the claimed subject matter and will recognize applications of these concepts not particularly addressed herein. It should be understood that these concepts and applications fall within the scope of the disclosure and the accompanying claims.

Moreover, it will be appreciated that any module, component, or device disclosed herein that executes instructions may include, or otherwise have access to, a non-transitory computer/processor readable storage medium or media for storage of information, such as computer/processor readable instructions, data structures, program modules and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile discs (i.e., DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Computer/processor readable/executable instructions to implement an application or module described herein may be stored or otherwise held by such non-transitory computer/processor readable storage media.

Figure 1:
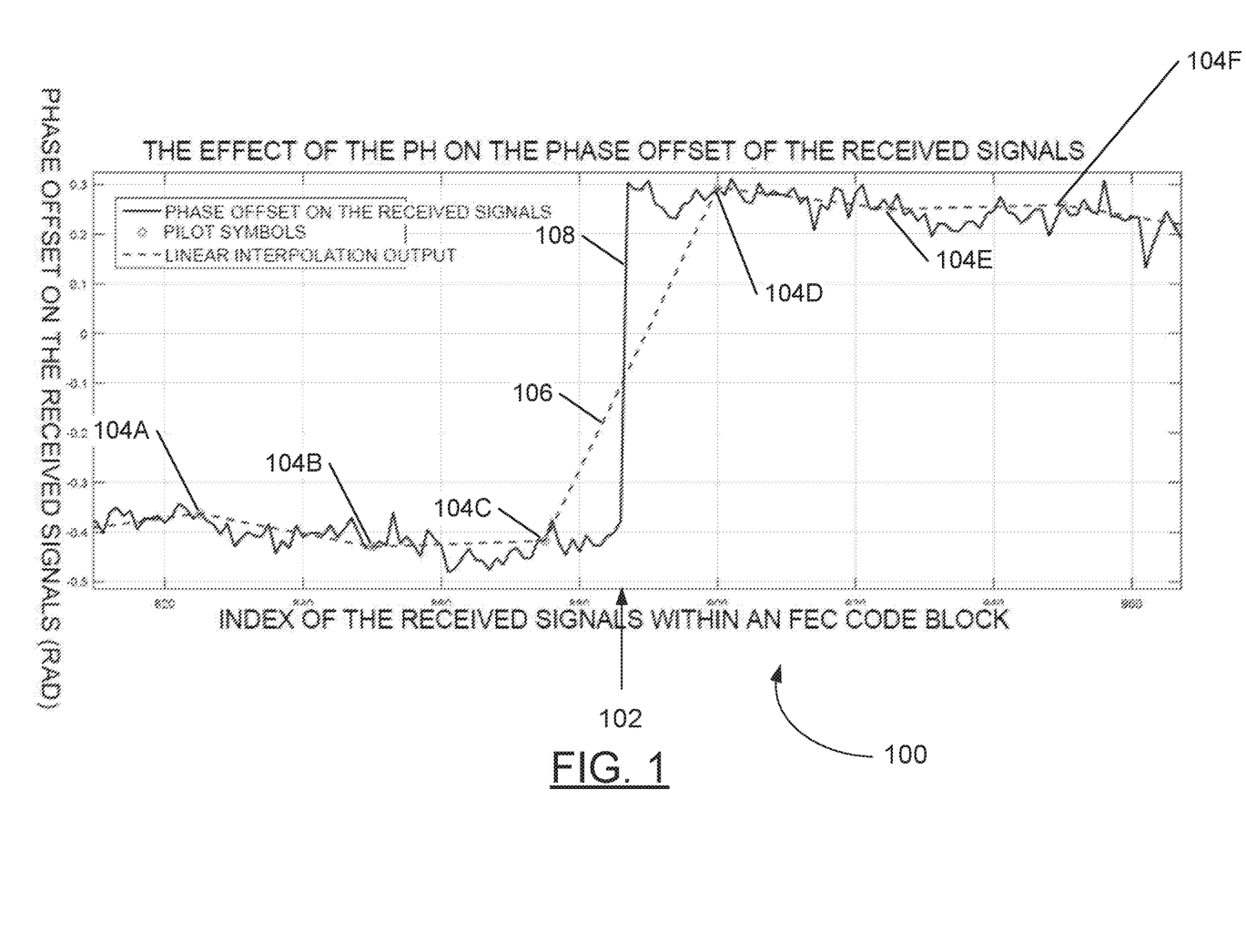
FIG. 1 illustrates a plot of phase offset of a plurality of received data symbols, showing a phase hit as a discontinuity in the phase offset.

A plot 100, presented in FIG. 1, illustrates a plurality of pilot symbol offset indications 104A, 104B, 104C, 104D, 104E, 104F (collectively or individually 104). Without a PH, the phase offsets for a full set of offset indications 104 is relatively small. When a PH occurs, a discontinuity in the phase offset 108 can be observed. In the graph of FIG. 1, a discontinuity occurs at index 102. Before index 102, the phase of the received signal is largely aligned with the phase of the LO. After the PH at index 102, the phases are no longer as relatively aligned. This shows an example of the extent to which the phase of received data symbols is offset from the phase of the reference signal provided by the local oscillator before and after a PH. The plot 100 further includes a representation 106 of a linear interpolation of phase offset based on interpolating between successive pilot symbol offset indications 104.

In overview, aspects of the present application relate to detecting a PH and, upon detecting the PH, determining the magnitude and location of the PH. The location of the PH may be expressed in terms of an index for a data symbol.

In statistical signal processing, schemes for deciding on whether an event has occurred or has not occurred is a well-studied topic. An event that may occur may be known as a hypothesis and the schemes are known as hypothesis testing.

For the case of detecting whether a PH has occurred, one hypothesis, $H_0$, may be used to represent a normal operating mode and another hypothesis, $H_1$, may be used to represent an operating mode subsequent to a PH. In the plot 100 in FIG. 1, the normal operating mode may be considered to be associated with the phase offset of each data symbol received before the index 102 and the operating mode subsequent to a PH may be considered to be associated with the phase offset of each data symbol received after the index 102.

For the PH phenomenon, we do not have any a priori information about $H_0$ and $H_1$. It can be shown that, when the a priori information is not available, a Neyman-Pearson binary hypothesis testing (NP-BHT) approach can optimize the probability of correctly detecting a specific hypothesis for a given false alarm (FA) probability.

A received data symbol, r, in the baseband may be represented as $r = s e^{j\varphi} + n$, where s represents amplitude, $\varphi$ represents a phase offset relative to the local oscillator and n represents noise.

One way to detect PH is to consider a difference, $Z_i$, between the phase offset, $\varphi_i$, of consecutive pilot symbols. In consideration of pilot symbols received at time $t_K$ and time $t_{K+1}$, the phase offset difference may be represented as:

$$Z_i \triangleq |\Delta \varphi_i| = |\varphi_i(t_{K+1}) - \varphi_i(t_K)| \, | i \in \{0,1\}.$$

The index i=0 is used herein to represent normal operating mode and the index i=1 is used herein to represent an operating mode following a PH (hereinafter "PH operating mode").

During the normal operating mode, the phase offset difference may be represented as:

$$Z_0 = |[\varphi_\omega(t_{K+1}) - \varphi_\omega(t_K)] + [\varphi_{PN}(t_{K+1}) - \varphi_{PN}(t_K)]|$$

where $\varphi_\omega$ is representative of an effect that Additive White Gaussian Noise (AWGN) can have on a phase offset and $\varphi_{PN}$ is phase offset due to local oscillator phase noise.

A random distribution of $\varphi_\omega$ may be obtained from:

$$\varphi_\omega \sim \mathcal{N}\left(0, \varepsilon\left\{\frac{|n|^2}{2}\right\} \cdot \varepsilon\{|s_p|^{-2}\}\right)$$

where $\varepsilon\{\bullet\}$ is the known expected value function and $\mathcal{N}(\mu, \sigma^2)$ is used to represent a Gaussian distribution with a mean $\mu$ and variance $\sigma^2$, and $s_p$ is used to represent the pilot symbols. Since the variance, $\sigma^2$, of $\varphi_\omega$ in a pilot is proportional to $\varepsilon\{|s_p|^{-2}\}$, the effect of the AWGN on the phase offset may be decreased by selecting the pilot symbols from a constellation with an energy of more than one.

The phase offset in a pilot, $\varphi_{PN}$, due to local oscillator phase noise may be modeled using the known Wiener random process. The variance of $\varphi_{PN}$ may be shown to depend on an overall phase noise level and a time difference with a certain reference point, i.e., $\varphi_{PN} \sim \mathcal{N}(\mu, \sigma_L^2 t)$. The value of the mean, $\mu$, is irrelevant in the present calculations, as will be explained in the following. The parameter $\sigma_L^2$ depends on the overall phase noise level and the pilot spacing. The time parameter, t, can be any time instance, e.g., a time instance at which a pilot symbol is sampled at the output of the matched filter. This results in $t=kT_s$, where k is an integer corresponding to an index of a sample of a pilot symbol and $T_s$ is a representation of a pilot symbol interval.

During the operating mode following a PH, the phase offset difference may be represented as:

$$Z_1 = |[\varphi_\omega(t_{k+1})-\varphi_\omega(t_k)]+[\varphi_{PN}(t_{k+1})-\varphi_{PN}(t_k)]+ [\varphi_{PH}(t_{k+1})-\varphi_{PH}(t_k)]|$$

where $\varphi_{PH}$ is a phase offset in consecutive pilots due to the PH.

Initially, a probability density function (pdf), $f_{XH}(x|H=0)$, is derived from statistics available for the normal operating mode phase offset difference, $Z_0$, and another pdf, $f_{XH}(x|H=1)$, is derived from statistics available for the post-PH operating mode phase offset difference, $Z_1$.

The NP-BHT approach involves determining a likelihood ratio, $\Lambda(x)$, of the normal operating mode phase offset difference pdf to the post-PH operating mode phase offset difference pdf as:

$$\Lambda(x) \triangleq \frac{f_{XH}(x|H=0)}{f_{XH}(x|H=1)}$$

A detection threshold, $\gamma_{NP}$, may be defined using a value, $\alpha_{FA}$, for a false alarm (FA) probability and a further statistic, $\sigma_P$, available for $Z_0$ and $Z_1$, as follows:

$$\gamma_{NP} = \Lambda\left(\sigma_P Q^{-1}\left(\frac{\alpha_{FA}}{2}\right)\right)$$

where the further statistic, $\sigma_p$, may be determined from:

$$\sigma_P^2 \triangleq \varepsilon\left\{\frac{|n|^2}{2}\right\} \cdot \varepsilon\{|s_p|^{-2}\} + \sigma_L^2 P T_s,$$

where $s_p$ represents the pilot symbols, $\sigma_L^2$ is the variance of Gaussian random variable used to generate the Wiener phase noise, P is the pilot spacing, expressed as a number of data symbols, and $T_s$ is the symbol interval.

Conveniently, the further statistic, $\sigma_p$, allows for a determination of the detection threshold to include known effects of thermal noise and known effects of local oscillator phase noise. Local oscillator phase noise is the term given to random phase variations that arise due to quality deficiencies in a given local oscillator. Additionally, recall that the value of the known Q function, $Q(x)$, is the probability that a standard normal random variable takes a value larger than x. Consequently, the inverse Q function, $Q^{-1}(y)$, is related to known error functions as follows:

$$Q^{-1}(y)=\sqrt{2}\mathrm{erf}^{-1}(1-2y)=\sqrt{2}\mathrm{erfc}^{-1}(2y).$$

Figure 2:
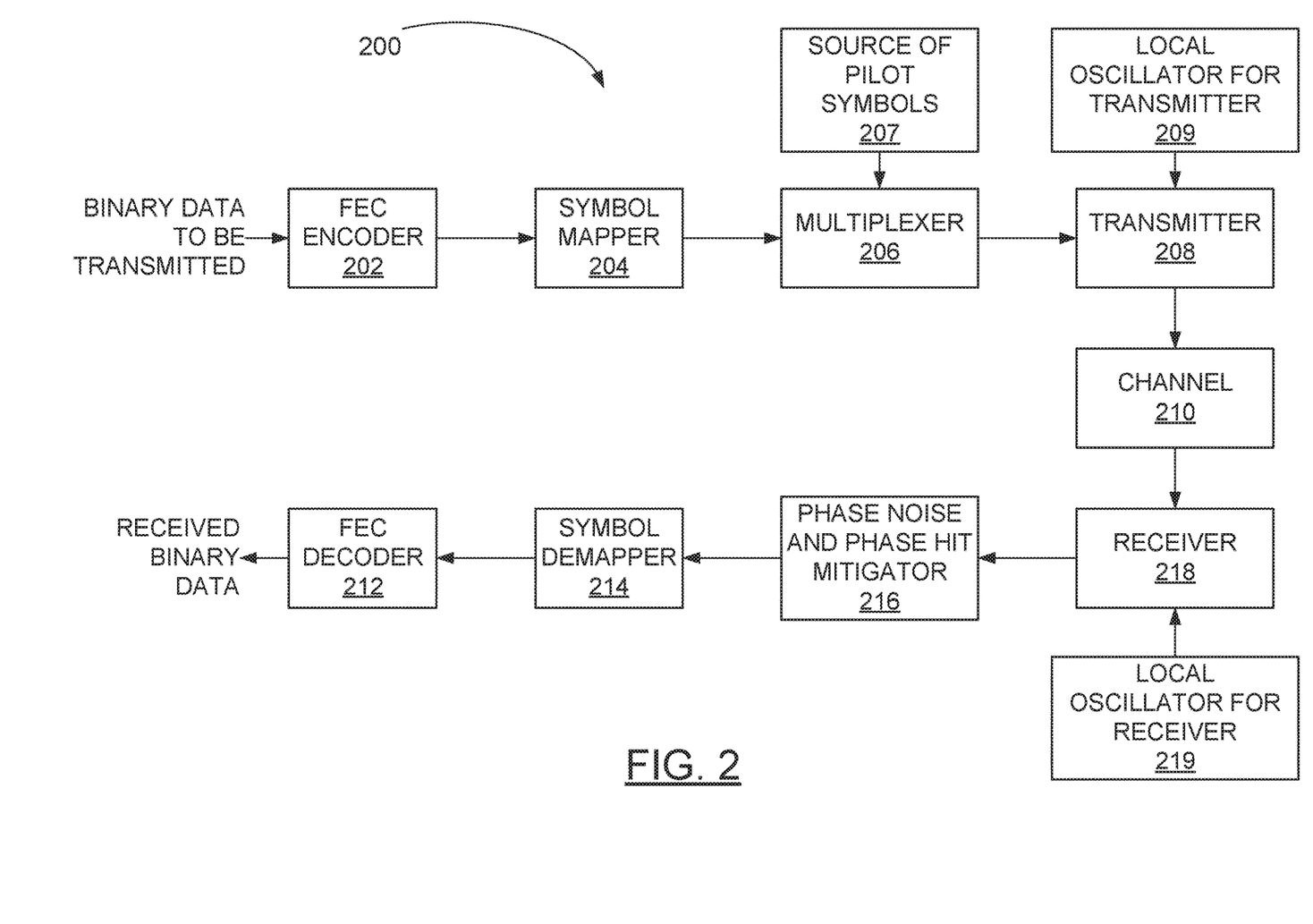
FIG. 2 illustrates, as a block diagram, a digital communication system, the system including a phase noise and phase hit mitigator, in accordance with aspects of the present application.

FIG. 2 illustrates, as a block diagram, a digital communication system 200. A transmission side of the system 200 includes a forward error correction (FEC) encoder 202 connected to symbol mapper 204, which, in turn, is connected to a multiplexer 206. The multiplexer 206, which maintains a connection with a source of pilot symbols 207, is connected to a transmitter 208. The transmitter 208 is connected to an associated local oscillator 209 and to a channel 210.

Also connected to the channel 210 is a receiving side of the system 200. The receiving side of the system 200 includes a receiver 218, which is connected to an associated local oscillator 219. The receiver 218 is also connected to a phase noise and phase hit mitigator 216, in accordance with aspects of the present application. The phase noise and phase hit mitigator 216 is connected to a symbol demapper 214. The symbol demapper 214 is connected to an FEC decoder 212.

Figure 3:
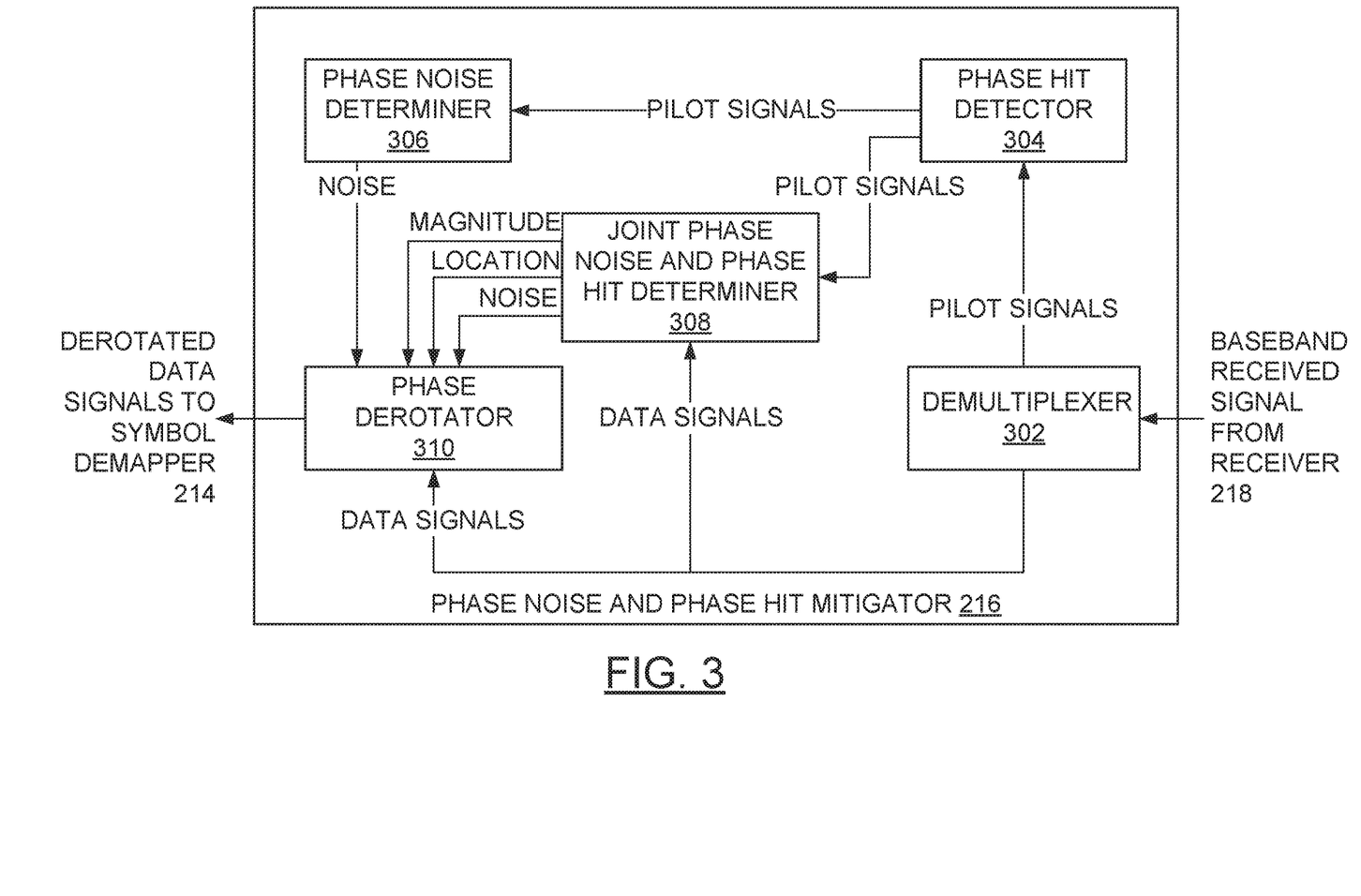
FIG. 3 illustrates, as a block diagram, the phase noise and phase hit mitigator of the system of FIG. 2, the phase noise and phase hit mitigator including a phase hit detector and a joint phase noise and phase hit determiner in accordance with aspects of the present application.

FIG. 3 illustrates, as a block diagram, the phase noise and phase hit mitigator 216 of the system 200 of FIG. 2. The phase noise and phase hit mitigator 216 includes a demultiplexer 302, which maintains a connection, on a pilot symbol side, to a phase hit detector 304 and a connection, on a data symbol side, to a phase derotator 310 and a joint phase noise and phase hit determiner 308. The phase hit detector 304 maintains a connection with the joint phase noise and phase hit determiner 308 and a connection with a phase noise determiner 306. The phase derotator 310 maintains a connection with the joint phase noise and phase hit determiner 308 and a connection with the phase noise determiner 306.

Figure 4:
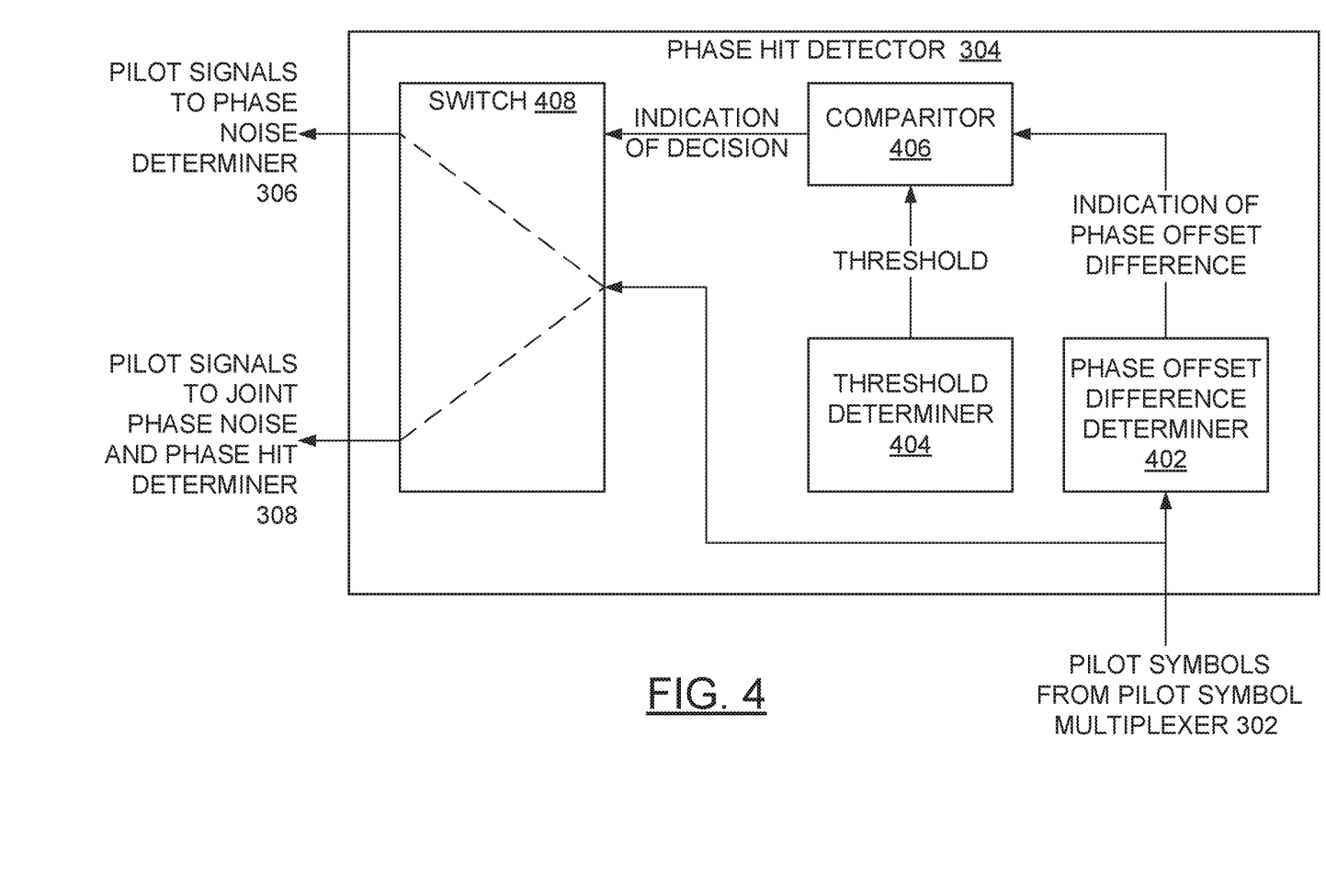
FIG. 4 illustrates, as a block diagram, the phase hit detector of the phase noise and phase hit mitigator of FIG. 3, in accordance with aspects of the present application.

FIG. 4 is a block diagram illustrating the design of an implementation of an embodiment of phase hit detector 304 of the phase noise and phase hit mitigator 216 of FIG. 3. The phase hit detector 304 includes a phase offset difference determiner 402. The phase hit detector 304 also includes a threshold determiner 404. Both the phase offset difference determiner 402 and the threshold determiner 404 maintain a connection to a comparator 406. The comparator 406 maintains a connection to a switch 408.

Figure 5:
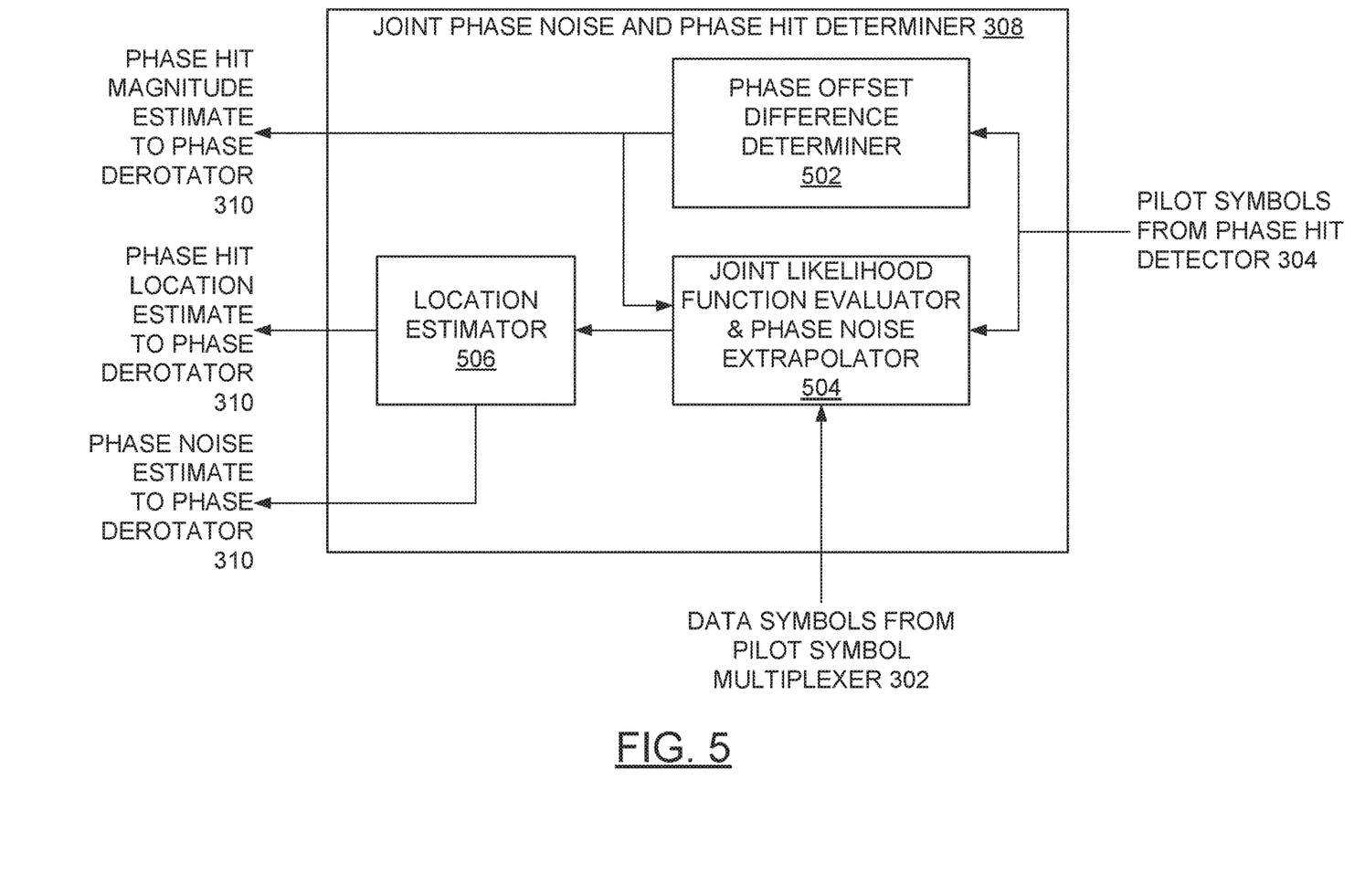
FIG. 5 illustrates, as a block diagram, the joint phase noise and phase hit determiner of the phase noise and phase hit mitigator of FIG. 3, in accordance with aspects of the present application.

FIG. 5 illustrates, as a block diagram, the joint phase noise and phase hit determiner 308 of the phase noise and phase hit mitigator 216 of FIG. 3. The joint phase noise and phase hit determiner 308 includes a phase offset difference determiner 502. The joint phase noise and phase hit determiner 308 also includes a joint likelihood function evaluator and phase noise extrapolator 504, which is connected to a location estimator 506.

In operation, binary data that is to be transmitted is encoded at the FEC encoder 202. The encoded output of the FEC encoder 202 is received at the symbol mapper 204, where each $\log_2 M$ bits are mapped to one symbol selected from among M symbols. The multiplexer 206 receives the selected symbol and passes the received symbol to the transmitter 208. Occasionally, the multiplexer 206 passes, to the transmitter 208, a pilot symbol received from the source of pilot symbols 207. The transmitter 208 modulates, according to each received symbol, a carrier signal received from the local oscillator 209 and transmits the modulated carrier signal on the channel 210.

The receiver 218 receives the modulated carrier signal from the channel 210 and obtains, through the use of a reference carrier signal received from the local oscillator 219, a baseband signal. The phase noise and phase hit mitigator 216 receives the baseband signal from the receiver 218 and passes indications of received symbols to the symbol demapper 214. The symbol demapper 214 converts each received indication of a symbol to the $\log_2 M$ bits that correspond to the symbol. The symbol demapper 214 passes the bits to the FEC decoder 212. The binary data at the output of the FEC decoder 212 should be the same as the binary data that was provided to the FEC encoder 202.

As illustrated in FIG. 2 and in FIG. 3, the phase noise and phase hit mitigator 216 receives a baseband signal from the receiver 218. Typically, the baseband signal includes both data symbols and pilot symbols. The demultiplexer 302 separates the data symbols from the pilot symbols. The demultiplexer 302 provides the pilot symbols to the phase hit detector 304. The demultiplexer provides the data symbols to the joint phase noise and phase hit determiner 308 and to the phase derotator 310. The phase derotator 310 provides derotated data signals to the symbol demapper 214.

Data symbols received at the demultiplexer 302 may be organized and indexed within a FEC code block. The time period that elapses between the receipt of adjacent pilot symbols may be designated as a "pilot section." There are a plurality of pilot sections in each FEC code block. For present purposes, the pilot section during which the PH has been detected may be designated as a "phase hit pilot section" (PHPS). The timing of the PH may be expressed as an index of a data symbol within the PHPS.

The phase hit detector 304 attempts to detect a PH in the current pilot section.

When no PH has been detected, the phase hit detector 304 passes the received pilot symbols to the phase noise determiner 306. The phase noise determiner 306 determines a phase noise, $\varphi_\omega(t_k)+\varphi_{PN}(t_k)$, for the received pilot symbol at time $t_k$ and a phase noise, $\varphi_\omega(t_{k+1})+\varphi_{PN}(t_{k+1})$, for the received pilot symbol at time $t_{k+1}$ to determine, through interpolation, an estimate, $\hat{\varphi}_q$, of local oscillator phase noise for each data symbol in the current pilot section. The phase noise determiner 306 then provides the phase noise estimates, $\hat{\varphi}_q$, to the phase derotator 310.

When the phase hit detector 304 detects a PH, the phase hit detector 304 passes the received pilot symbols to the joint phase noise and phase hit determiner 308. The joint phase noise and phase hit determiner 308 also receives the received data symbols from the demultiplexer 302. The joint phase noise and phase hit determiner 308 processes the received pilot symbols to determine a magnitude, λ, of the PH, jointly estimates the local oscillator phase noise, $\hat{\varphi}_q$, of the data symbols in the PHPS and determines a location, $\hat{\xi}$, for the PH in the PHPS. The joint phase noise and phase hit determiner 308 provides, to the phase derotator 310, the estimated magnitude, λ, of the PH, the estimated location, $\hat{\xi}$, of the PH and the estimated local oscillator phase noise, $\hat{\varphi}_q$.

Specifics of the operation of the phase hit detector 304 may be considered in view of FIG. 4. Upon receiving successive pilot symbols from the demultiplexer 302, the phase offset difference determiner 402 acts to determine a difference between the respective phase offsets of the received pilot symbols. The phase offset difference determiner 402 passes an indication of any determined phase offset difference to the comparator 406. The comparator 406 also receives, from the threshold determiner 404, an indication of a value for the detection threshold, $\gamma_{NP}$. The comparator 406 determines whether a PH has been detected by comparing the phase offset difference, received from the phase offset difference determiner 402, to the detection threshold, $\gamma_{NP}$, received from the threshold determiner 404. In particular, the comparator 406 may determine that a PH has been detected by determining that the received phase offset difference exceeds the detection threshold, $\gamma_{NP}$. Output from the comparator 406 comprises an indication of a decision regarding whether a phase hit has been detected. The switch 408 receives the indication along with the pilot symbols from the pilot symbol demultiplexer 302. On the basis of the received indication, the switch directs the received pilot symbols. That is, based on receiving the indication that a PH has not been detected, the switch 408 directs the received pilot symbols to the phase noise determiner 306. Conversely, based on receiving the indication that a PH has been detected, the switch 408 directs the received pilot symbols to the joint phase noise and phase hit determiner 308.

The pilot symbols are not only directed to the joint phase noise and phase hit determiner 308 upon detection of a phase hit. Received pilot symbols may also be stored in a buffer (not shown), such that the joint likelihood function evaluator and phase noise extrapolator 504 may have access to a pilot symbol at the beginning of the pilot section that precedes the PHPS, or a pilot symbol at the end of the pilot section that follows the PHPS, for the purposes of extrapolation. Such an embodiment will be described below.

Specifics of the operation of the joint phase noise and phase hit determiner 308 may be considered in view of FIG. 5. Upon receiving successive pilot symbols from the phase hit detector 304, the phase offset difference determiner 502 determines a difference between the phase offsets of the successive pilot symbols that define the phase hit pilot section. The determined difference in the phase offsets can be provided as an input to the phase derotator 310 as an estimate of the magnitude of the phase hit. Upon receiving the successive pilot symbols from the phase hit detector 304, the joint likelihood function evaluator and phase noise extrapolator 504 extrapolates a local oscillator phase noise detected in the pilot section preceding the PHPS and extrapolates a local oscillator phase noise detected in the pilot section following the PHPS. In some embodiments, the extrapolations are for at least one of the pilot sections immediately preceding and immediately following the PHPS.

The joint likelihood function evaluator and phase noise extrapolator 504 provides, to the location estimator 506, a value of a likelihood function (discussed hereinafter), along with a value of a location parameter at which the likelihood function was evaluated. The location estimator 506 may use multiple pairs of likelihood function values and associated location parameters when determining an estimate of the timing of the PH. Upon completing the determining, the location estimator 506 may provide the timing estimate to the phase derotator 310 along with an estimate for the local oscillator phase noise for each data symbol in the phase hit pilot section.

Figure 6:
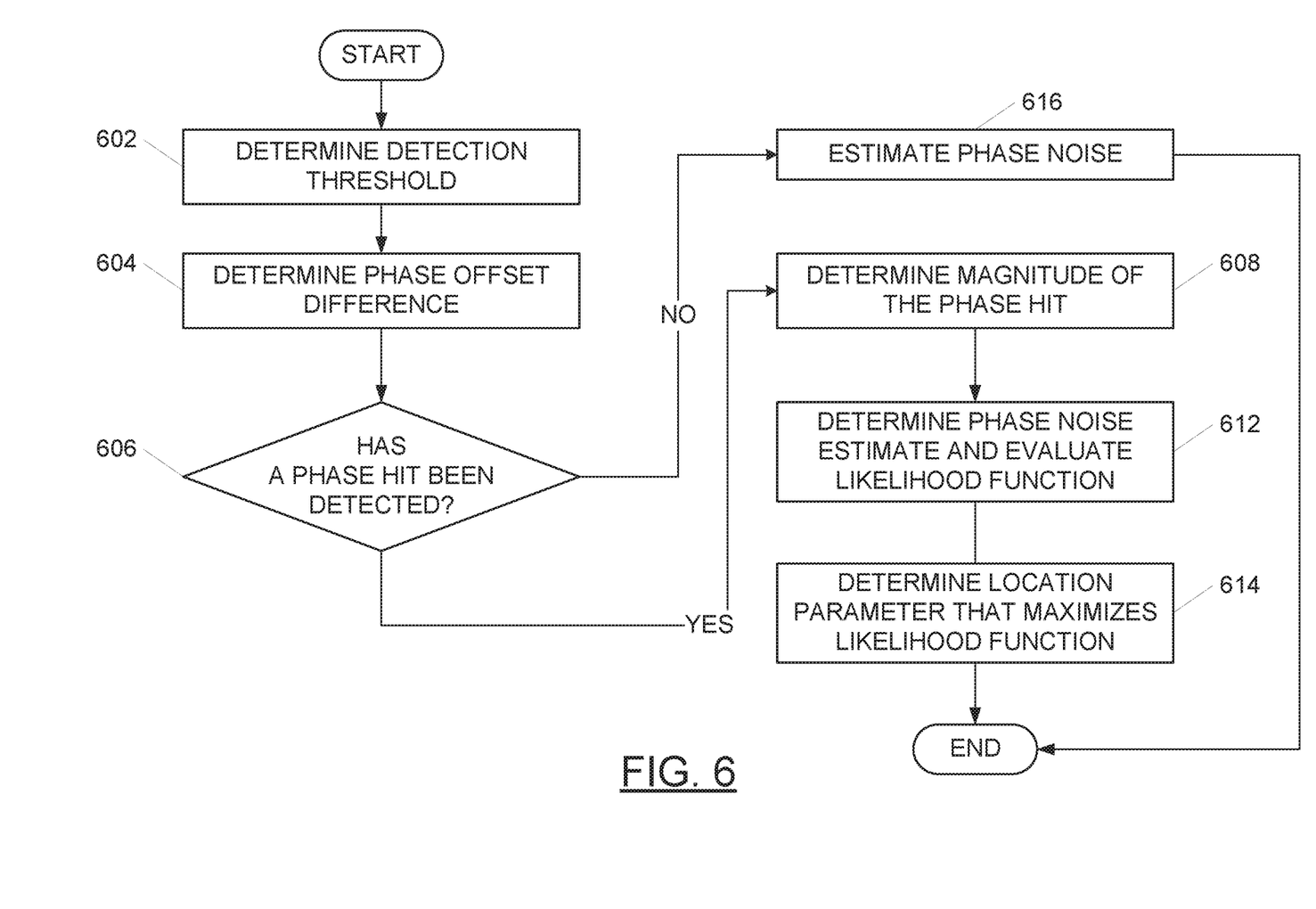
FIG. 6 is a flow chart that illustrates steps in a method of detecting and mitigating a phase hit including, according to aspects of the present disclosure, evaluating a plurality of potential phase hit location parameters.

FIG. 6 is a flow chart that illustrates steps in a method of detecting a PH according to an embodiment of the present invention. Although reference is made to the elements of the system described above, these steps may, in some methods, be carried out by other elements. Reference to the elements of FIG. 4 are provided to ease understanding of particular embodiments and are not intended to be limiting in scope. Initially, the threshold determiner 404 (see FIG. 4) determines (step 602) the detection threshold, $\gamma_{NP}$. The phase offset difference determiner 402 (see FIG. 4) determines (step 604) a phase offset difference, $|\varphi_i(t_{K+1})-\varphi_i(t_K)|$, for two successive received pilot symbols. The comparator 406 (see FIG. 4) may then determine (step 606) whether a PH has been detected by comparing the phase offset difference, received from the phase offset difference determiner 402, to the detection threshold, $\gamma_{NP}$, received from the threshold determiner 404. In particular, the comparator 406 may determine (step 606) that a PH has been detected by determining that the received phase offset difference exceeds the detection threshold, $\gamma_{NP}$. Upon determining (step 606) that a PH has been detected between the time, $t_K$, of receipt of one pilot symbol and the time, $t_{K+1}$, of receipt of the next pilot symbol, there are further details to be determined.

Upon determining (step 606) that the phase offset difference does not exceed the detection threshold, a phase noise estimate may be determined (step 614) for each of the pilot symbols. This may be done by the phase nose determiner 306. The phase noise determiner 306 may operate in a manner consistent with the operation of the phase offset difference determiner 502. The phase noise determiner 306 may provide an estimate of local oscillator phase noise, for each of the data symbols, to the phase derotator 310.

Upon determining (step 606) that a PH has been detected, the phase offset difference determiner 502 may determine (step 608) an estimate of the magnitude of the PH and provide the magnitude estimate to the phase derotator 310 and to the joint likelihood function evaluator and phase noise extrapolator 504. The joint likelihood function evaluator and phase noise extrapolator 504 may determine (step 612) a phase noise estimate for each data symbol and provide the phase noise estimate to the location estimator 506 while evaluating (step 612) a plurality of potential phase hit location parameters and providing the results of the evaluating to the location estimator 506. Furthermore, the location estimator 506 may determine (step 614) a location parameter that maximizes the likelihood function and provide, as an estimate of the timing of the PH, the location parameter that maximizes the likelihood function to the phase derotator 310 along with the phase noise estimate for each data symbol, where the phase noise estimate is associated with the location parameter that maximizes the likelihood function.

The determining (step 608) of an estimate of the magnitude, $\lambda$, of the detected PH may be simplified to determining, at the phase offset difference determiner 502, the phase offset difference, $|\varphi_i(t_{K+1}) - \varphi_i(t_K)|$, for the two pilot symbols that define the PHPS.

Figure 7:
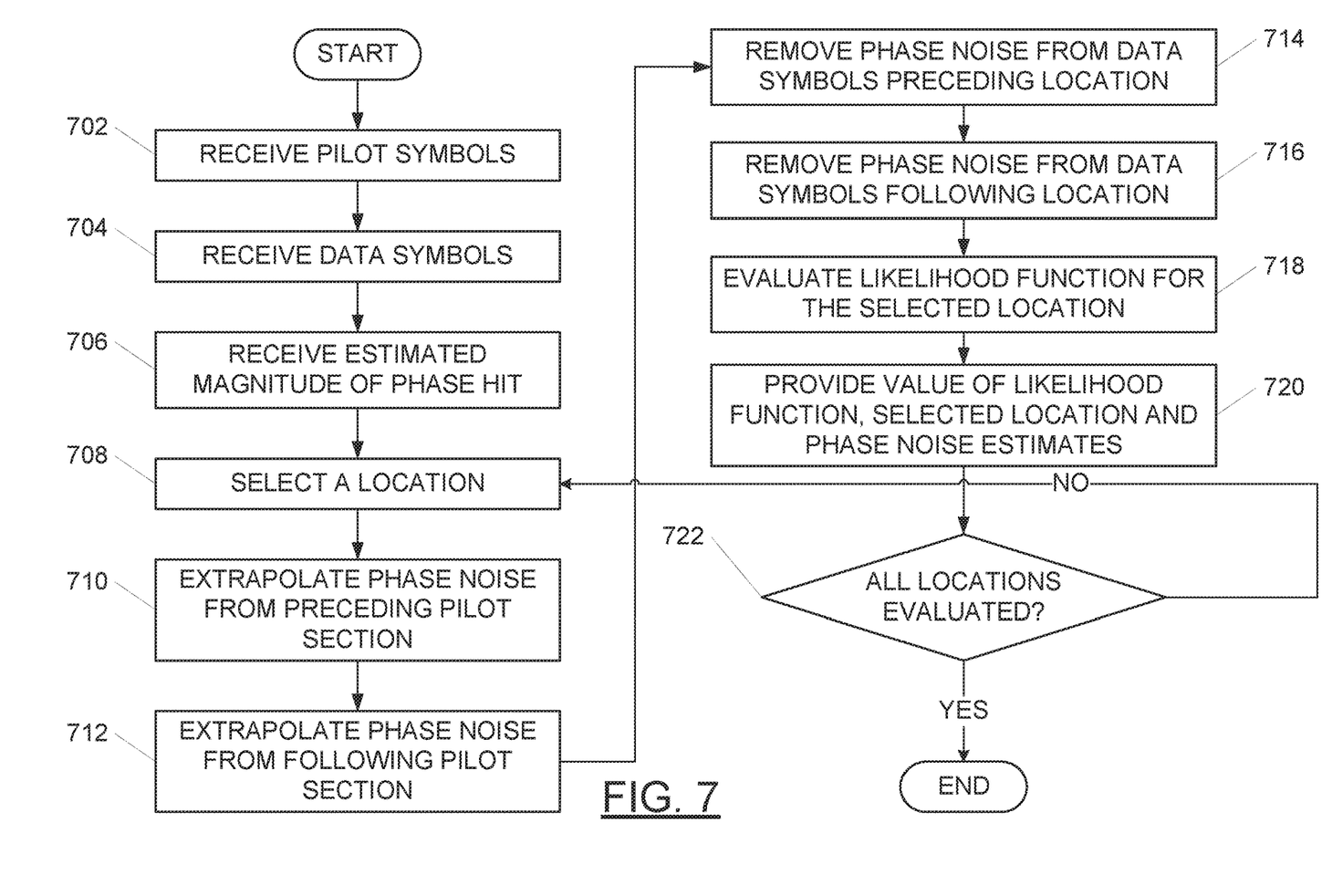
FIG. 7 is a flow chart that illustrates steps in a method of evaluating the plurality of potential phase hit location parameters in the method of FIG. 6, according to aspects of the present disclosure.

Example steps in a method of evaluating (step 612) the plurality of potential phase hit location parameters are illustrated in FIG. 7. Once again, the method of FIG. 7 is described, for explanatory purposes, in conjunction with the elements of other figures. This is intended only to ease understanding of an embodiment, and should not be considered as limiting or required. The method begins as the joint likelihood function evaluator and phase noise extrapolator 504 receives (step 702) pilot symbols from the phase hit detector 304. The joint likelihood function evaluator and phase noise extrapolator 504 also receives (step 704) data symbols from the pilot symbol demultiplexer 302. Even further, the joint likelihood function evaluator and phase noise extrapolator 504 receives (step 706) the estimate of the magnitude, $\lambda$, of the detected phase hit from the phase offset difference determiner 502.

It may be understood that that in the presence of a phase hit, interpolation between the pilot symbols that define the phase hit pilot section would be ineffective. It is proposed herein to extrapolate local oscillator phase noise that may be identified in a pilot section immediately preceding a phase hit pilot section and extrapolate local oscillator phase noise that may be identified in a pilot section immediately following the phase hit pilot section. In theory, the local oscillator phase noise extrapolated from the preceding pilot section may be used to estimate and remove at least a portion of local oscillator phase noise in the phase hit pilot section for data symbols preceding the phase hit. Furthermore, also in theory, the local oscillator phase noise extrapolated from the following pilot section may be used to estimate and remove at least a portion of local oscillator phase noise in the phase hit pilot section for data symbols following the phase hit. Those skilled in the art will appreciate that in some embodiments it is preferable to remove all the LO phase noise, but it many embodiments this may not be possible or necessary. Mitigation of the LO phase noise may be sufficient in some embodiments.

In some embodiments, removal of the estimated local oscillator phase noise can be performed as a part of processing the data symbols to allow for detection of the location of the phase hit. Unfortunately, in some embodiments, the location of the phase hit is unavailable at the time of the removal of the estimated phase noise. The phase noise attributable to the LO can be estimated and mitigated from each of the data symbols in the phase hit pilot section in accordance with an extrapolation of the phase noise identified in a related pilot section. A "related" pilot section, for a particular data symbol on a particular side of the phase hit, is, in some embodiments, the adjacent pilot section on the particular side of the phase hit. This allows mitigation of the LO phase noise, in accordance with an estimate of the noise, in data symbols in the PHPS preceding a selected location parameter, $\xi$, in accordance with an extrapolation of the LO phase noise identified in the preceding pilot section. Similarly, removal of the LO phase noise, in accordance with an estimate of the noise, in data symbols in the phase hit pilot section following the selected location parameter, $\xi$, can be achieved in accordance with an extrapolation of the LO phase noise identified in the following pilot section.

Referring to FIG. 7, the joint likelihood function evaluator and phase noise extrapolator 504 selects (step 708) a location parameter, $\xi$. The joint likelihood function evaluator and phase noise extrapolator 504 then extrapolates (step 710) local oscillator phase noise from the preceding pilot section, that is, the pilot section bounded by the pilot symbol at $t_{k-1}$ and the pilot symbol at $t_k$. The joint likelihood function evaluator and phase noise extrapolator 504 may then extrapolate (step 712) local oscillator phase noise from the following pilot section, that is, the pilot section bounded by the pilot symbol at $t_{k+1}$ and the pilot symbol at $t_{k+2}$.

For each received data symbol, $r_q$, in the phase hit pilot section preceding the location parameter, $\xi$, the joint likelihood function evaluator and phase noise extrapolator 504 removes (step 714) a local oscillator phase noise estimate, $\hat{\varphi}_q$, that is based on the extrapolation (step 710) of the local oscillator phase noise from the preceding pilot section.

For each received data symbol, $r_q$, in the phase hit pilot section following the location parameter, $\xi$, the joint likelihood function evaluator and phase noise extrapolator 504 removes (step 716) a local oscillator phase noise estimate, $\hat{\varphi}_q$, that is based on the extrapolation (step 712) of the local oscillator phase noise from the following pilot section.

The joint likelihood function evaluator and phase noise extrapolator 504 then evaluates (step 718) a likelihood function for location parameter, $\xi$, selected in step 708 as follows:

$$l(\xi) = \sum_{q=1}^{P} \log f(r_q | \xi),$$

where the received data symbol with an estimate of the local oscillator phase noise removed, $r_{q\lambda}$, may be represented as $r_q = s_q e^{j\theta_q} + n_q$ with the term $\theta_q = \varphi_q - \hat{\varphi}_q$ and the term P being representative of pilot spacing. That is, the term P is representative of the number of data symbols received between pilot symbols. Additionally, the function $f(r_1, r_2, \ldots, r_P | \xi)$ is the joint pdf of all the received signals within the PHPS after removing the local oscillator phase noise and conditioned on knowing the PH location, $\xi$. It may be assumed that the received data symbols with the estimate of the local oscillator phase noise removed, $r_q$, are independent and identically distributed.

It may be considered that there are two independent sets of received signals in the PHPS. One set of received signals (data symbols and pilot symbols) before the PH and one set of received signals (data symbols and pilot symbols) after the PH. The likelihood function, $l(\xi)$, may be evaluated (step 718), by the joint likelihood function evaluator and phase noise extrapolator 504, using the independence of the received signals in the PHPS as follows:

$$l(\xi) = C_1 \sum_{q=1}^{\xi-1} \log \sum_{m=1}^{M} e^{-\frac{|r_q - s_m|^2}{2N_0}} + C_2 \sum_{q=\xi}^{P} \log \sum_{m=1}^{M} e^{-\frac{|r_q - s_m e^{j\lambda}|^2}{2N_0}}$$

where M is the number of data symbols in the constellation in use and $N_0$ is one-sided power spectral density of the AWGN.

In aspects of the present application, detecting the PH location, $\xi$, may be accomplished, by the joint likelihood function evaluator and phase noise extrapolator 504 evaluating the likelihood function, $l(\xi)$, for a range of values for the location parameter, $\xi$. The joint likelihood function evaluator and phase noise extrapolator 504 may provide (step 720), to the location estimator 506, the value of the likelihood function, $l(\xi)$, found by evaluating (step 718) the likelihood function, $l(\xi)$, along with the value of the location parameter, $\xi$, at which the likelihood function was evaluated and the estimates, $\hat{\varphi}_q$, of the local oscillator phase noise associated with the location parameter, $\xi$, which local oscillator phase noise estimates, $\hat{\varphi}_q$, are determined in steps 710 and 712. Upon completing the evaluating (step 718) and the providing (step 720), the joint likelihood function evaluator and phase noise extrapolator 504 may determine (step 722) whether all potential location parameters in the phase hit pilot section have been selected and evaluated. Upon determining (step 722) that all potential location parameters in the phase hit pilot section have not been selected and evaluated, the joint likelihood function evaluator and phase noise extrapolator 504 returns to select (step 712) another selected location parameter, $\xi$. The extrapolation (steps 710, 712) of the local oscillator phase noise, the removal (steps 714, 716) of the estimates, $\hat{\varphi}_q$, of the local oscillator phase noise with, evaluation (step 718), and the providing (step 720) may then be carried out in the context of the freshly selected location parameter, $\xi$.

Responsive to the joint likelihood function evaluator and phase noise extrapolator 504 having determined (step 722) that all potential location parameters in the phase hit pilot section have been selected (step 712) and evaluated (step 718), the location estimator 506, selects a maximizing location parameter, $\hat{\xi}$, where the maximizing location parameter is the location parameter that maximizes the likelihood function, $l(\xi)$. That is, the location estimator 506 determines (step 616, FIG. 6) the maximizing location parameter, $\hat{\xi}$, by evaluating $$\hat{\xi} = \underset{\xi}{\arg\max}\,[l(\xi)].$$

Unfortunately, it may be shown that the maximization does not have a closed form. However, the pilot spacing, P, is commonly a relatively small number, e.g., 50. Accordingly, an approach wherein the location estimator 506 is allowed, by the joint likelihood function evaluator and phase noise extrapolator 504, to employ an exhaustive search for the maximizing location parameter, $\hat{\xi}$, may be considered to be viable.

Upon finding the maximizing location parameter, $\hat{\xi}$, the location estimator 506 provides the maximizing location parameter, $\hat{\xi}$, to the phase derotator 310 along with extrapolated local oscillator phase noise estimates, $\hat{\varphi}_q$, associated with the maximizing location parameter, $\hat{\xi}$. The received data symbols after the PH location may be derotated, at the phase derotator 310, by a combination of the extrapolated local oscillator phase noise estimate, $\hat{\varphi}_q$, and the estimated PH magnitude, $\lambda$. Such a de-rotation may be expressed as follows:

$$\hat{r}_q = \begin{cases} r_q e^{-j\hat{\varphi}_q} & 1 \le q \le \hat{\xi} - 1 \\ r_q e^{-j\hat{\varphi}_q} e^{-j\lambda} & \hat{\xi} \le q \le P \end{cases} \Rightarrow \hat{r}_q = s_q e^{j\theta_q} + \hat{n}_q$$

where $\theta_q$ is representative of the residual local oscillator phase noise estimate and where $\hat{n}_q$ is representative of the rotated Gaussian noise sample, which is statistically equivalent with $n_q$ due to the known circular symmetry of Gaussian noise.

Consequently, the data symbols received after the PH may be more correctly processed by the symbol demapper 214 and the FEC decoder 212 (see FIG. 2) in contrast to an accuracy with which the same data symbols would have been processed without accounting for the presence of the PH.

Conveniently, the method, illustrated in the combination of FIG. 6 and FIG. 7 may be shown to have a relatively low probability (lower than $10^{-9}$) of giving false alarms (also referred to as false positives). A false alarm is defined as determining (step 606) that a PH has been detected in an instance wherein a PH has not occurred. Furthermore, the method illustrated in FIG. 6 may be shown to have a relatively low probability (lower than $10^{-9}$) of missing a PH event, that is, determining (step 606) that a PH has not been detected in an instance wherein a PH has occurred. Moreover, it may be shown that aspects of the present application impose very little extra computational burden to the system.

Further conveniently, since aspects of the present application are implemented in the baseband, it follows that any changes in the local oscillator and radio frequency chain structures are avoided.

It should be appreciated that one or more steps of the embodiment methods provided herein may be performed by corresponding units or modules. For example, data may be transmitted by a transmitting unit or a transmitting module. Data may be received by a receiving unit or a receiving module. Data may be processed by a processing unit or a processing module. The respective units/modules may be hardware, software, or a combination thereof. For instance, one or more of the units/modules may be an integrated circuit, such as Field Programmable Gate Arrays (FPGAs) or Application-Specific Integrated Circuits (ASICs). It will be appreciated that where the modules are software, they may be retrieved by a processor, in whole or part as needed, individually or together for processing, in single or multiple instances as required, and that the modules themselves may include instructions for further deployment and instantiation.

Although a combination of features is shown in the illustrated embodiments, not all of them need to be combined to realize the benefits of various embodiments of this disclosure. In other words, a system or method designed according to an embodiment of this disclosure will not necessarily include all of the features shown in any one of the Figures or all of the portions schematically shown in the Figures. Moreover, selected features of one example embodiment may be combined with selected features of other example embodiments.

Although this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for mitigating an occurrence of a phase hit, the method comprising:
    receiving a signal comprising a plurality of data symbols and a plurality of pilot symbols;
    detecting a first phase offset between a signal from a local oscillator and a first pilot symbol among the plurality of pilot symbols;
    detecting a second phase offset between the signal from the local oscillator and a second pilot symbol among the plurality of pilot symbols, the second pilot symbol successive to the first pilot symbol; and
    responsive to determining that a phase hit has occurred, processing each respective data symbol in a phase hit pilot section, defined as being between the first pilot symbol and the second pilot symbol, that is at a location subsequent to a location of the phase hit,
    wherein a phase hit is determined to have occurred when a phase offset difference between the first phase offset and the second phase offset exceeds a detection threshold and
    wherein the processing comprises:
        determining a magnitude of the phase hit; and
        altering a phase of each respective data symbol by the magnitude of the phase hit.

2. The method of claim 1, wherein the location of the phase hit comprises an index of a data symbol among the plurality of data symbols.

3. The method of claim 1 wherein the magnitude of the phase hit is determined in accordance with the phase offset difference between the first phase offset and the second phase offset.

4. The method of claim 1 further comprising, responsive to determining that a phase hit has occurred, determining the location of the phase hit by:
    selecting a location within the phase hit pilot section, the selected location associated with a given data symbol among the plurality of data symbols;
    generating a likelihood function value to associate with the given data symbol;
    repeating the selecting of a location and generation of a likelihood function value; and
    determining, as the location of the phase hit, the selected location associated with the given data symbol associated with the greatest likelihood function value among the repeated generation of likelihood function values.

5. The method of claim 4 further comprising:
    detecting a third pilot symbol within the received signal, the first pilot symbol successive to the third pilot symbol, wherein a time period that elapses between receipt of the third pilot symbol and the first pilot symbol is designated a preceding pilot section;
    detecting a fourth pilot symbol within the received signal, the fourth pilot symbol successive to the second pilot symbol, wherein a time period that elapses between receipt of the second pilot symbol and the fourth pilot symbol is designated a subsequent pilot section;
    determining local oscillator phase noise in the preceding pilot section;
    determining second local oscillator phase noise in the subsequent pilot section;
    extrapolating the local oscillator phase noise in the preceding pilot section;
    extrapolating the local oscillator phase noise in the subsequent pilot section;
    removing at least a portion of the extrapolated local oscillator phase noise in the preceding pilot section from the received data symbols preceding the location of the phase hit; and
    removing at least a portion of the extrapolated local oscillator phase noise in the subsequent pilot section from the received data symbols following the location of the phase hit.

6. The method of claim 5, wherein the removing, from the given data symbol, at least a portion of the extrapolated local oscillator phase noise in the preceding pilot section or the removing, from the given data symbol, at least a portion of the extrapolated local oscillator phase noise in the subsequent pilot section before the generating the likelihood function value to associate with the given data symbol.

7. The method of claim 1 wherein the detection threshold is determined by evaluating:

$$\Lambda\left(\sigma_P Q^{-1}\left(\frac{\alpha_{FA}}{2}\right)\right)$$

where:

$$\gamma_{NP} = \Lambda\left(\sigma_P Q^{-1}\left(\frac{\alpha_{FA}}{2}\right)\right)$$

where $\alpha_{FA}$ represents a false alarm probability and $\Lambda(x)$ is defined as a ratio of probability density functions, as follows:

$$\Lambda(x) \triangleq \frac{f_{XH}(x|H=0)}{f_{XH}(x|H=1)}$$

where $f_{XH}(x|H=0)$ is representative of a probability density function for phase offset difference during operation in a normal mode and $f_{XH}(x|H=1)$ is representative of a probability density function for phase offset difference during operation in a post phase hit operating mode.

8. An apparatus for mitigating an occurrence of a phase hit, the apparatus comprising:
    a receiver configured to receive a signal comprising a plurality of data symbols and a plurality of pilot symbols;

a local oscillator; and a processor configured to:

detect a first phase offset between a signal from the local oscillator and a first pilot symbol among the plurality of pilot symbols;

detect a second phase offset between the signal from the local oscillator and a second pilot symbol among the plurality of pilot symbols, the second pilot symbol successive to the first pilot symbol; and determine that a phase hit has occurred when a phase offset difference between the first phase offset and the second phase offset exceeds a detection threshold; and process each respective data symbol in a phase hit pilot section, defined as being between the first pilot symbol and the second pilot symbol, that is at a location subsequent to a location of the phase hit, the processing including determining a magnitude of the phase hit and altering a phase of each respective data symbol by the magnitude of the phase hit.

9. The apparatus of claim 8 wherein the processor is further configured to determine the detection threshold by evaluating:

$$\Lambda\left(\sigma_P Q^{-1}\left(\frac{\alpha_{FA}}{2}\right)\right)$$

where:

$$\gamma_{NP} = \Lambda\left(\sigma_P Q^{-1}\left(\frac{\alpha_{FA}}{2}\right)\right)$$

where $\alpha_{FA}$ represents a false alarm probability and $\Lambda(x)$ is defined as a ratio of probability density functions, as follows:

$$\Lambda(x) \triangleq \frac{f_{XH}(x|H=0)}{f_{XH}(x|H=1)}$$

where $f_{XH}(x|H=0)$ is representative of a probability density function for phase offset difference during operation in a normal mode and $f_{XH}(x|H=1)$ is representative of a probability density function for phase offset difference during operation in a operating mode.

10. The apparatus of claim 8 wherein the processor is configured to determine the magnitude of the phase hit by determining the phase offset difference between the first phase offset and the second phase offset.

11. The apparatus of claim 8 wherein the processor is further configured to determine the location of the phase hit by:

selecting a location within the phase hit pilot section, the selected location associated with a given data symbol among the plurality of data symbols;

generating a likelihood function value to associate with the given data symbol;

repeat the selecting of a location and generating of a likelihood function value; and determining, as the location of the phase hit, the selected location associated with the given data symbol associated with greatest likelihood function value among the repeated generation of likelihood function values.

12. The apparatus of claim 11 wherein the processor is further configured to:

detect a third pilot symbol within the received signal, the first pilot symbol successive to the third pilot symbol, wherein a time period that elapses between receipt of the third pilot symbol and the first pilot symbol is designated a preceding pilot section;

detect a fourth pilot symbol within the received signal, the fourth pilot symbol successive to the second pilot symbol, wherein a time period that elapses between receipt of the second pilot symbol and the fourth pilot symbol is designated a subsequent pilot section;

determine local oscillator phase noise in the preceding pilot section;

determine local oscillator phase noise in the subsequent pilot section;

extrapolate the local oscillator phase noise in the preceding pilot section;

extrapolate the local oscillator phase noise in the subsequent pilot section;

remove at least a portion of the extrapolated local oscillator phase noise in the preceding pilot section from the received data symbols preceding the location of the phase hit; and remove at least a portion of the extrapolated local oscillator phase noise in the subsequent pilot section from the received data symbols following the location of the phase hit.

13. The apparatus of claim 12 wherein the processor is further configured to remove, from the given data symbol, at least a portion of the extrapolated local oscillator phase noise in the preceding pilot section or remove, from the given data symbol, at least a portion of the extrapolated local oscillator phase noise in the subsequent pilot section before the generating the likelihood function value to associate with the given data symbol.

14. A non-transitory computer-readable medium storing instructions that, when executed by a processor, cause the processor to:

receive a signal comprising a plurality of data symbols and a plurality of pilot symbols;

detect a first phase offset between a signal from a local oscillator and a first pilot symbol among the plurality of pilot symbols;

detect a second phase offset between the signal from the local oscillator and a second pilot symbol among the plurality of pilot symbols, the second pilot symbol successive to the first pilot symbol; and process each respective data symbol, in a phase hit pilot section that is defined as being between the first pilot symbol and the second pilot symbol, that is at a location subsequent to a location of the phase hit, wherein a phase hit is determined to have occurred when a phase offset difference between the first phase offset and the second phase offset exceeds a detection threshold, and wherein the processing comprises:

determining a magnitude of the phase hit; and altering a phase of each respective data symbol by the magnitude of the phase hit.

15. The non-transitory computer-readable medium of claim 14, wherein the instructions cause the processor to determine the location of the phase hit in the signal by:

selecting a location within the phase hit pilot section, the selected location associated with a given data symbol among the plurality of data symbols;

generating a likelihood function value to associate with the given data symbol;

repeating the selecting of a location and generation of a likelihood function value; and determining, as the location of the phase hit, the location associated with the greatest likelihood function value among the repeated generation of likelihood function values.

16. The non-transitory computer-readable medium of claim 15, wherein the instructions further cause the processor to:

detect a third pilot symbol within the received signal, the first pilot symbol successive to the third pilot symbol, wherein a time period that elapses between receipt of the third pilot symbol and the first pilot symbol is designated a preceding pilot section;

detect a fourth pilot symbol within the received signal, the fourth pilot symbol successive to the second pilot symbol, wherein a time period that elapses between receipt of the second pilot symbol and the fourth pilot symbol is designated a subsequent pilot section;

determine local oscillator phase noise in the preceding pilot section;

determine second local oscillator phase noise in the subsequent pilot section;

extrapolate the local oscillator phase noise in the preceding pilot section;

extrapolate the local oscillator phase noise in the subsequent pilot section;

remove at least a portion of the extrapolated local oscillator phase noise in the preceding pilot section from the received data symbols preceding the location of the phase hit; and remove at least a portion of the extrapolated local oscillator phase noise in the subsequent pilot section from the received data symbols following the location of the phase hit.

17. The non-transitory computer-readable medium of claim 14, wherein the instructions cause the processor to determine the magnitude of the phase hit in accordance with the phase offset difference between the first phase offset and the second phase offset.

18. The non-transitory computer-readable medium of claim 14, wherein the instructions cause the processor to determine the detection threshold by evaluating:

$$\Lambda\left(\sigma_P Q^{-1}\left(\frac{\alpha_{FA}}{2}\right)\right)$$

where:

$$\gamma_{NP} = \Lambda\left(\sigma_P Q^{-1}\left(\frac{\alpha_{FA}}{2}\right)\right)$$

where $\alpha_{FA}$ represents a false alarm probability and $\Lambda(x)$ is defined as a ratio of probability density functions, as follows:

$$\Lambda(x) \triangleq \frac{f_{XH}(x \mid H=0)}{f_{XH}(x \mid H=1)}$$

where $f_{XH}(x|H=0)$ is representative of a probability density function for phase offset difference during operation in a normal mode and $f_{XH}(x|H=1)$ is representative of a probability density function for phase offset difference during operation in a post phase hit operating mode.

\* \* \* \* \*